United States Patent

[11] 3,613,091

[72] Inventors Ralph H. Thomas
Northfield;
Ronald S. Perloff, Warrensville, both of Ohio
[21] Appl. No. 863,889
[22] Filed Oct. 6, 1969
[45] Patented Oct. 12, 1971
[73] Assignee Electron-Ohio, Inc.

[54] CODE TRANSLATOR
8 Claims, 4 Drawing Figs.

[52] U.S. Cl. 340/347 DD, 235/155
[51] Int. Cl. H04l 3/00
[50] Field of Search 340/347; 235/155

[56] References Cited

UNITED STATES PATENTS

| | | | |
|---|---|---|---|
| 3,493,928 | 2/1970 | Juliusburger | 340/347 DD |
| 3,271,517 | 9/1966 | De Rosa | 340/347 |
| 3,241,134 | 3/1966 | Looschen | 340/347 |
| 2,946,044 | 7/1960 | Bolgiano | 340/347 |

*Primary Examiner*—Thomas A. Robinson
*Assistant Examiner*—Jeremiah Glassman
*Attorney*—McNenny, Farrington, Pearne & Gordon

ABSTRACT: A device for translating a multibit input code into a desired multibit output code including a double-ended decoding circuit which converts the signals representing an input character into a single signal and apparatus which encodes this single signal into the signals representing a corresponding output character.

PATENTED OCT 12 1971 3,613,091

SHEET 1 OF 3

INVENTORS
RALPH H. THOMAS
RONALD S. PERLOFF

BY
*McNenny, Farrington, Pearne & Gordon*
ATTORNEYS

INVENTORS
RALPH H. THOMAS
RONALD S. PERLOFF

BY
McNenny, Farrington, Pearne & Gordon
ATTORNEYS

INVENTORS
RALPH H. THOMAS
RONALD S. PERLOFF

BY
McNenny, Farrington, Pearne & Gordon
ATTORNEYS

CODE TRANSLATOR

FIELD OF THE INVENTION

This invention relates to code conversion apparatus and more specifically it relates to an electronic code translator for converting digital characters of a first code into corresponding digital characters of a second code.

Data represented in the form of one code must often be converted into a second code for subsequent handling of the data on a computer, a machine, or for efficient electronic transmission of the data. Various code conversion equipment has been provided in the past. Often such equipment has been characterized by a high degree of complexity making it relatively expensive. Additionally, much of this equipment has been specially designed for converting from one specific code to a second specific code and, due to basic structure, is not adapted to be used with other input or output codes.

The present invention provides an apparatus which may be economically produced and which, owing to its basic structure may be used to convert a variety of input codes into, generally, any desired output code.

An immediate and significant application of the present invention is the conversion of 12-bit Hollerith code into any desired code having 8 or less bits for its representation.

SUMMARY OF THE INVENTION

The code translator of this invention decodes a multibit input character by selecting a unique wire associated with this input character from a bundle of wires representing all of the input characters. The wire is selected by passing a current signal through it and this current signal is simultaneously encoded into a corresponding multibit output character.

A double-ended decoding technique is used to select the associated wire. Electrical logic provides, at one end of the circuitry, a source of current at a first junction representing a portion of the input character. At the opposite end of the circuitry, the electrical logic provides a current sink at a second junction representing the remaining portion of the input character. The bundle of wires is arranged so that only one wire conducts current between this pair of first and second junctions. Each wire of the bundle is selectively threaded, according to the desired output character representation, through a combination of transformer cores. The transformer cores are associated with the bits or channels of the output code. Only the transformer cores through which the wire passes are excited when current flows between the junctions. The output character is represented or encoded by a combination of high or low signal levels determined by the excited and nonexcited transformer cores.

In the illustrated embodiment the code translator is arranged to convert from Hollerith code to any desired output code having eight output channels. At one end of the decoding logic circuit, the field group of the Hollerith code, namely channels 0, 11, and 12, is decoded into all of its eight signal level possibilities. At the other end of the decoding logic circuit, the digit group, channels 1–9, is decoded into all 12 of its legal signal level combinations. This double ended arrangement minimizes the number of circuit components or drivers which are necessary to decode the Hollerith input code.

In addition to converting Hollerith code of 12 bits into a more compact code of eight or less bits, the code translator of this invention may be used as an expander to expand 5-bit code into, for instance, 8-bit code.

DESCRIPTION OF THE PREFERRED EMBODIMENT

Figure 1A:
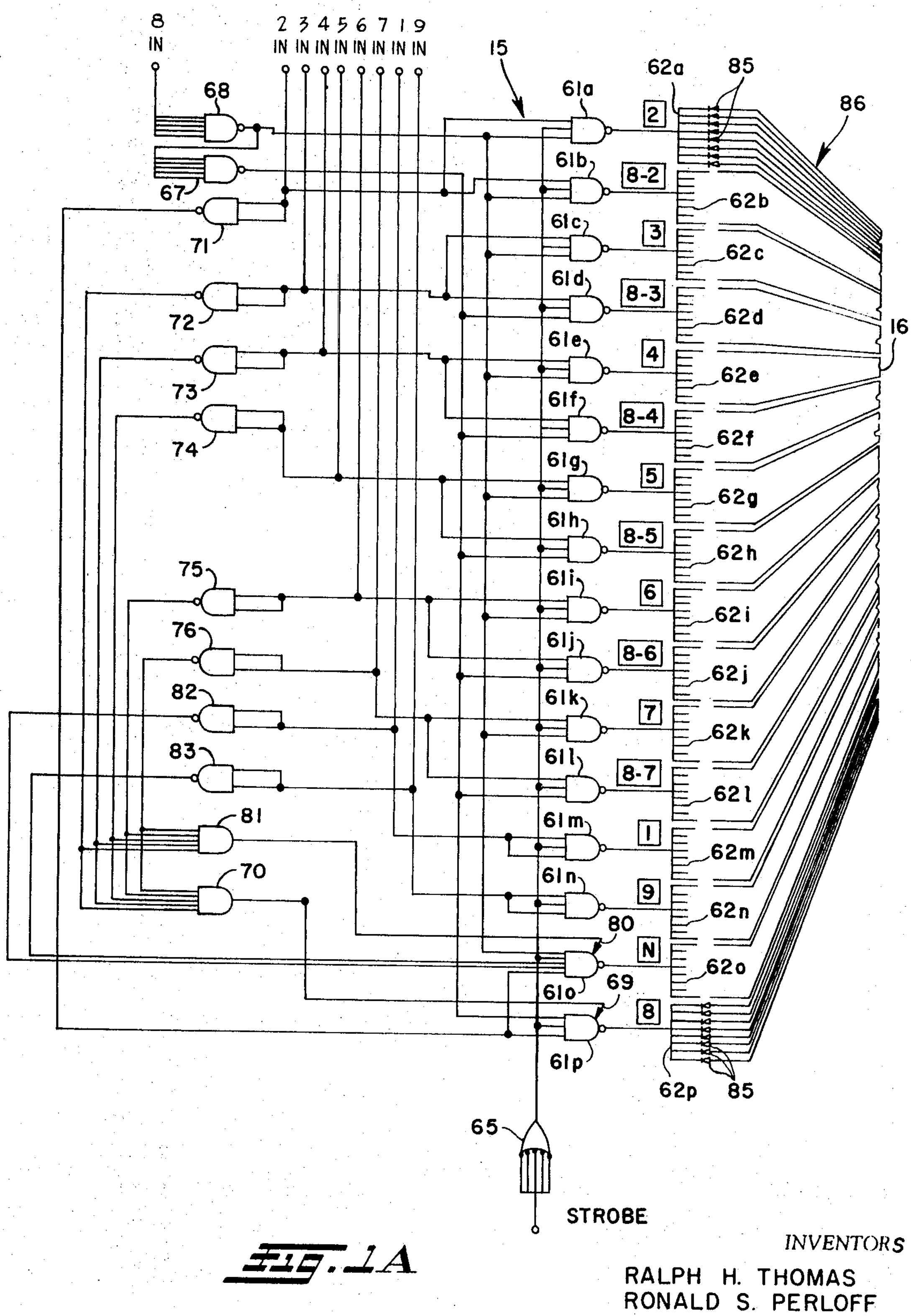
FIG. 1A shows schematically that portion of the logic circuitry which decodes the digit lines 1–9.
Figure 1B:
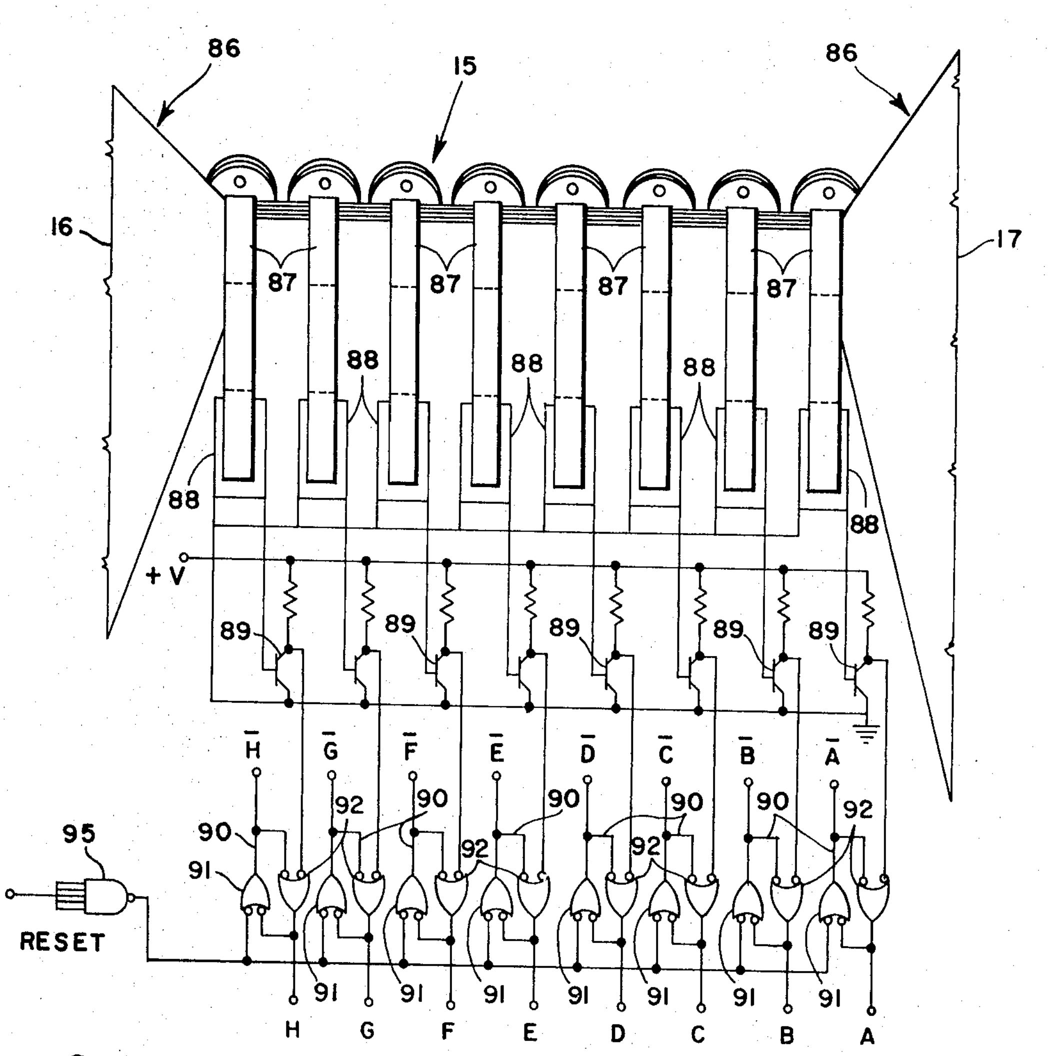
FIG. 1B shows schematically the transformer core memory and associated output channels.
Figure 1C:
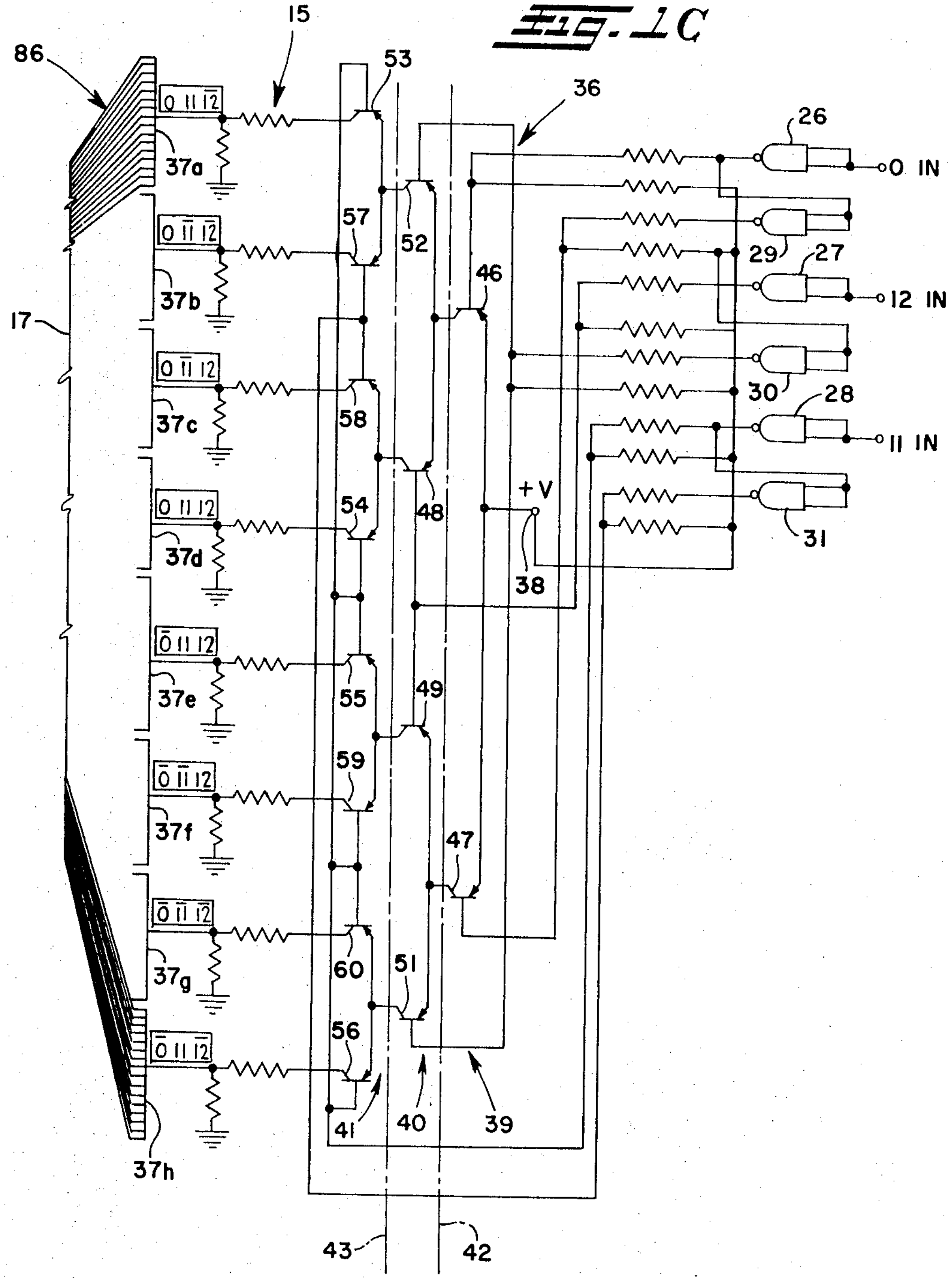
FIG. 1C shows schematically the logic circuitry which decodes the field group 0, 11, and 12, of the input code.

For the sake of clarity in the drawings, the circuitry of the code translator of this invention has been shown in three figures, namely, FIGS. 1A, 1B, and 1C. For a proper understanding of the circuit, FIG. 1A should be positioned directly to the left of FIG. 1B and FIG. 1C should be positioned directly to the right of FIG. 1B. From this arrangement, it may be seen that the broken line 16 shown in FIG. 1A is the same line 16 shown in FIG. 1B. Likewise, the broken line 17 shown in FIG. 1B is the same line 17 shown in FIG. 1C. These lines 16 and 17 are provided to indicate where FIGS. 1A and 1C are to be joined to FIG. 1B.

As mentioned above, the preferred embodiment of this invention is adapted to translate legal Hollerith code into any desired output code of eight bits. It should, nevertheless, be understood that the principles of the invention may be applied to the conversion of various other input codes utilizing a greater or lesser number of input bits than the 12 bits of Hollerith code. Likewise, the invention may be adapted to provide various output codes utilizing more or less than eight bits.

Hollerith punched card code utilizes 12 channels or bits in its representation. The 12 channels of this code are normally considered to comprise two groups, the field group 0, 11, and 12, and the digit group 1–9. As is understood by those skilled in the art, only certain signal level combinations on these channels are defined as legal. That is, only certain combinations of signal levels or true and false states on these channels are normally used. These various combinations may be represented on a punched card where, for each channel, a hole represents a true signal and the absence of a hole represents a false signal.

All of the eight possible combinations of true and false signals provided by the field group are legal. Only limited set of 16 true and false signal combinations out of all of the possible combinations of the digit group are legal. Since any of the eight combinations of the digit group are legal. Since any of the eight combinations of the field group may be combined with any of the allowed 16 combinations of the digit group, a total number of 128 characters, equal to the product of these combinations, is available with the Hollerith punched card code.

According to this invention, the 12 bits of Hollerith code are divided into two input groups corresponding to the field and digit groups. That is, the input channels of the code translator of this invention are separated into two groups in the electronic circuitry to facilitate the decoding or identification of an input Hollerith code character.

To identify an input character, a current signal is emitted at a point in the circuitry representing the field combination of that character and a current sink is provided at another point in the circuitry representing the digit combination of the character. The circuitry includes a conducting wire between the point emitting current and the point sinking current. The conducting wire is unique to that character or pair of points. It is the only wire of a bundle of wires associated with all of the possible legal characters carrying current. This wire and the remaining wires of the bundle are selectively threaded through combinations of a set of transformer cores. Current through a wire produces a multibit output code character corresponding to the chosen combination of threaded and nonthreaded transformer cores.

Referring now to FIG. 1C, a portion of a code translator 15 is shown which includes a set of three input channels representing the three bits 0, 11, and 12 of the field group of Hollerith code. The code translator 15 of the invention is adapted to receive electrical signals at its input channels from a card reader or other device supplying signals representing Hollerith code.

Positive logic is used in the circuit diagram of the code translator 15. The most positive signal voltage level is a binary 1 or true signal and the most negative signal voltage level is a binary 0 or false signal. Thus, a high positive signal voltage at any of the input channels, including the three channels 0, 11, and 12, represents the presence of a hole in the corresponding code bit of a punched card. A set of three gates 26, 27, and 28 are associated with true or high positive signal levels on the channels 0, 12, and 11, respectively, of the field group. An additional set of gates 29, 30, and 31 are associated with the false or low voltage signal levels of the field group channels 0, 12, and 11. These gates 26–31 and the other gates discussed below comprise integrated circuits. The functions of these gates are represented by their various conventional symbols, which are familiar to those skilled in the art.

Each of the gates 26–31 provides a signal at its output which is inverted or is opposite in level from the signal at its input. Since the outputs of the three gates 26–28 are tied to the inputs of the associated or complementary gates 29–31, the outputs of each pair of gates 26 and 29, 27 and 30, and 28 and 31 will be inverted or complementary to the other. The gates 26–31 are connected to drive a plurality of transistors which form a logic tree 36.

The transistor logic tree 36 controls a series of junctions 37*a-h*. Each junction 37 represents one of the eight combinations of true or false or high or low signals possible at the three field group channels 0, 11, and 12. The transistor tree 36 decodes an input signal combination at the input channels 0, 11, and 12 by selecting a junction 37 which corresponds to such combination. The proper junction 37 is selected by opening a conducting path to it from a source of current 38 through three branches 39, 40, and 41 of the transistor tree 36. A set of vertical broken lines 42 and 43 is provided to distinguish these branches 39–41 for the purposes of this description. The branches 39, 40, and 41 are associated with the input channels 0, 12, and 11, respectively.

When a true or high signal is applied to the input channel 0, the output of the gate 26 goes low or close to ground potential to turn on or forward bias a transistor 46 of the first branch 39 of the logic tree 36. Alternatively, when the voltage signal level at the input channel 0 is false or near ground potential, the gate 26 provides a high level voltage, which in turn is inverted at the complementary gate 29 of the channel 0. The inverted or low voltage level at the output of the complementary gate 29 turns on a second transistor 47 of the first branch 39, while the original high level signal at the output of the gate 26 turns off the first transistor 46 of this first branch.

Thus, when the input voltage signal level at channel 0 is true or high level, the first transistor 46 makes current available from the source 38 to the upper half of the logic tree. This is indicated at the upper junctions 37*a–d* where a notation 0, in a box, shows that the voltage signal at channel 0 must be true or high level for current to flow to these upper four junctions. Oppositely, the second transistor 47 makes current available to the lower four junctions 37*e–h* when the voltage signal at channel 0 is low level or false, as is indicated by the $\overline{0}$ boxed notation on these lower four junctions.

In like manner, a centermost pair of transistors 48 and 49 of the second branch 40 of the logic tree are forward biased by the output of the gate 27 to pass current from the source 38 and one of the transistors of the first branch 39 when the voltage signal at channel 12 is high or true. This is indicated by the boxed notation 12 on the center four junctions 37*c–f* where the signal at channel 12 must be true in order for current to flow to any of these junctions. Outer transistors 51 and 52 of the second branch 40 are similarly associated with the four outer junctions 37*a*, *b* and 37*g*, *h* and with false signals at channel 12.

The third branch 41 of the logic tree is associated with channel 11. Like the circuit operation in the other branches 39 and 40, a true or high level signal at channel 11 turns on a group of transistors 53–56 while, alternatively, a low level signal at channel 11 turns on the remaining transistors 57–60 which is shown by the boxed notation of 11 or $\overline{11}$ at the associated junctions 37*a–h*.

From a study of the circuitry of the logic tree 36 it will be understood that for any combination signal levels at the input channels 0, 11, and 12 only one complete conducting path will be available from the current source 38 through the transistors to a junction 37. Thus, the logic tree selects the junction 37 associated with an input signal combination at the field channels 0, 11, and 12. The logic tree 36 is well suited for decoding these channels since all combinations of signal levels on these channels are legal and the tree arrangement inherently provides all of these combinations.

A group of resistors nearest the gates 26–31, which are unnumbered for the sake of clarity, are provided to properly bias the transistors of the logic tree 36. The resistors between the junctions 37*a–h* and the transistors 53–60 of the third branch 41 are provided to limit the current flowing through each junction 37.

Referring now to FIG. 1A, a second group of input channels 1–9 is provided. These channels are associated with the digit group of Hollerith code. The various legal combinations of high and low level signals at these channels 1–9 are represented by 16 junctions 62*a–p*. The legal combinations are identified at these junctions 62*a–p* by a boxed notation adjacent each junction. A series of NAND gates 61*a-p* is provided for the second group of junctions 62*a–p*. The output of each of these gates 61*a–p* is connected to the associated junction 62*a–p*.

When a legal combination of signal levels appears on the input channels 1–9 and a strobe signal is applied to the junction gates 61*a–p*, a single gate 61 representing this combination is selected to provide a current sink to ground potential at its associated junction 62.

The logic components or gates required for this selection operation is greatly reduced by using a "don't care" approach in decoding the digit input signals. The legal digit signal combinations are (1) a high voltage level or true signal on any one of the input channels 1–9 with the remaining input channels at a low voltage signal or false, (2) combinations of a true signal on any one of the input channels 2–7 with a simultaneous true signal on the input channels 2–7 with a simultaneous true signal on the input channel 8, and (3) a false signal on all of the input channels 1–9. Various other possible combinations of signal levels on the input channels 1–9 such as simultaneous true signals on channels 2 and 3 are ignored. That is, the logic circuitry doesn't care or doesn't check for such a possible combination, since it is not defined as a legal Hollerith code combination.

Since the combination of a true or high signal on one of the channels 2–7 and channel 8 is sensed directly by the gate associated with such a combination. Thus, each gate 61*b*, *d*, *f*, *h*, *j*, and l has one of its inputs connected to an associated input channel 2–7, and another input connected to a gate 67 which reproduces the state of the input signal at channel 8. Because of the NAND function, none of these gates will be energized until both of the signals on its associated channels are true.

The gates 61*a*, *c*, *e*, *g*, *i*, and k, associated with the legal combinations of a single true signal on one of the channels 2–7, ignore combinations of simultaneous true signals on one of the channels and channel 8. Each of these gates has one input connected to an associated gate 2–7 and one input connected to a gate 68 which inverts the signal at the input channel 8. Only when the signal at channel 8 is low level or false is there a true signal output from the gate 68. This insures that none of the latter group of gates will be energized if a true signal occurs both at the associated channels 2–7 and at channel 8.

Again, to distinguish from simultaneous true signals at channels 2–7 and channel 8, the gate 61*p*, associated with a single true signal at channel 8, determines that all input signals on the input channels 2–7 are simultaneously false. An input expander 69 on this gate 61*p* is connected to an expander gate 70, which is in turn connected to a group of inverting gates 72–76, which permit the gate 70 to supply a true signal to the input expander 69 only when the signals at terminals 3–7 are false. Another input terminal on the gate 61*p* is connected to an inverting gate 71, which permits a true signal to be applied to this input only when the signal level at channel 2 is false Since a true signal at either of the remaining input terminals 1 or 9 cannot legally occur simultaneously with a true signal at the input channel 8, the logic circuitry doesn't care about such possibilities and does not check for them before the gate 61*p* is energized.

The gate 61*o* and the junction 62*o* are associated with the legal signal combination of all false or low level signals at the input channels 1–9. The gate 61*o* has an expander 80 which requires, by means of an expander gate 81 and the inverting gates 72–76, that the signals at the terminals 3–7, respectively, are false. Additional inputs to the gate 61*o* are connected to a pair of inverting gates 82 and 83, which require that the signal levels applied to the channels 1 and 9 respectively are false before the gate becomes energized. The inverting gate 71 associated with the input channel 2 and the inverting gate 68 associated with the input channel 8 are connected to other inputs of the gate 61*o* to insure that the signals at these remaining channels are also false before the gate 61*o* is energized.

It is illegal to combine a true or high level signal from a second channel of the digit group with either the input channel 1 or the input channel 9. Thus, for either channel 1 or 9 there is no need to check the signal level at any other digit channel. This is shown in the circuitry at the associated gates 61*m* and 61*n* where the input terminals of each of these gates are shorted together directly to the line connecting them with their associated input channels 1 and 9.

According to the NAND function, all of the inputs to one of the junction gates 61*a–p* must be true before it is energized and its output goes false or approaches ground potential to provide a current sink at its associated junction 60*a–p*. It may be seen that all of the junction gates 61*a–*p have an input associated with a strobe gate 65. To satisfy the NAND function of the gates 61*a–p*, a true signal must be supplied by the strobe gate 65 before any of the gates will operate. The strobe input allows the logic circuitry to stabilize before allowing any of these gates to function.

It should be understood that only one of these junction gates 61*a–p* at any one time may have all of its inputs true. That is, there is a unique gate in this series of junction gates for each legal combination of true and false input signals of the digit group input channels 1–9. As mentioned above there is also a unique junction for each legal level combination at the first or field group input channels 0, 11, and 12. Thus it may be understood that a legal Hollerith character will have a first group combination of signal levels represented by one of the first group junctions 37*a–h* and will have a second group combination of signal levels represented by one of the second group junctions 60*a–p*. A first and second group junction pair will be unique for each of the 128 legal Hollerith characters.

A bundle of wires 86 connects the field group junctions 37*a–h* to the digit group junctions 62*a–p*. A separate wire of the bundle 86 connects, at one end, each first or field group junction 37 with each second or digit group junction 60 at its other end. Thus, there is a wire representing each pair combination of first and second group junctions. Since each possible pair combination of first and second group junctions also represents each possible legal Hollerith code, each wire represents a Hollerith code character.

In FIGS. 1A and 1C, for the sake of clarity, wires of the bundle 86 have been shown terminating only at the junctions 37*a*, *h* and 62*a*, *p*. It should be understood that the remaining junctions 37*b–g* and 62*b–o* are similarly connected by the wires. A diode 85 is provided between the end of each wire and the junctions 61*a–p* for electrical isolation between these wires to prevent error signals.

As indicated above, a first junction 37 associated with an input character to be translated is selected to receive current from the current source 38. The second group junction 62 associated with the character to be translated will provide a current sink by means of the associated gate 61. The particular wire associated with the input character to be translated is thereby selected to carry a current signal as it will be the only wire having both a current source at one end and a current sink at the other. A device which in such a manner separates a set of input signals into two groups of signal level combinations and decodes these input signals into a single, separate signal passing between two points or ends of the device each associated with a signal level combination of one of the groups may be described as a double-ended decoder.

To fully translate the input character, the decoded current signal in the selected wire is encoded into a corresponding word or out put character. This is accomplished by selectively threading each wire of the bundle 86 through combinations of a set of linear ferrite transformer cores 87 according to a desired or predetermined output code. The number of cores 87 corresponds to the number of output bits or channels, which in the illustrated embodiment is eight. The cores 87 describe or encode an output character or word according to the combination or cores which the related wire either passes through or bypasses. At each output channel A–H, current passing through a wire which is threaded through a core produces an output signal of one state and current in the wire passing around a core produces a signal of the opposite state.

The set of ferrite cores 87 may be described as a memory device from which an output character or word may be read by passing current through a wire associated with that character. The memory is "hard wired", meaning that separate wires or conductors are threaded through the cores in predetermined patterns or combinations, so that an output character can not be forgotten. The Hollerith input code character may be considered an address of the output character in the memory.

Figure 2:
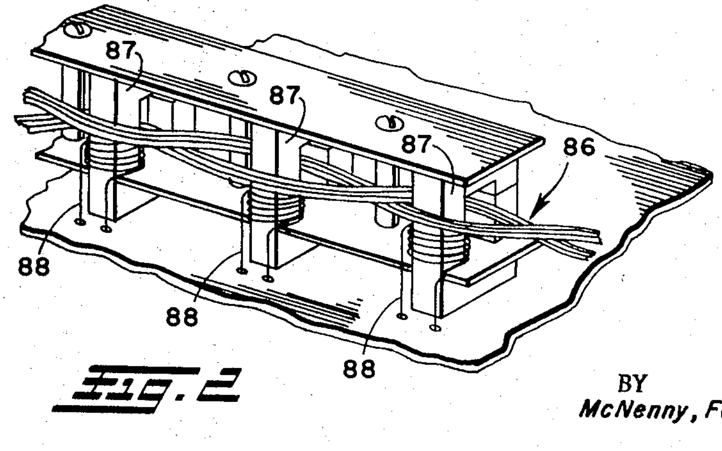
FIG. 2 is a fragmentary perspective view of a number of the transformer cores which are shown schematically in FIG. 1B.

Current in a wire passing through a transformer core 87 induces a current in a secondary winding 88 of the core. FIG. 2 shown the physical arrangement of the cores 87, the wires of the bundle 86 selectively threaded through three of these cores, and the secondary windings 88 associated with these cores.

Current in a secondary winding 88 is amplified by an associated transistor 89. Each amplifying transistor 89 drives a latch circuit 90 associated with each output channel A–H. A latch 90 comprises a pair of cross-coupled NOR gates 91 and 92. One input of each gate 91 and 92 is connected to the output of the other gate. The other inputs of each pair of gates 91 and 92 provide two inputs for each latch 90. The amplifying transistor 89, when current flows through a wire threaded through its associated core, drives the input of its latch 90, at the gate 92, to a low level or false signal so that the output A–H of the latch will provide a high level or true signal. The output of the latch 90 will remain or be latched in this high level until another signal is provided by a reset gate 95.

The gate 95 resets all of the latch circuits 90 at a high level at their output terminals A–H to a low level at the end of each cycle of character translation. A latch 90 is reset when the gate 95 produces a low level or false signal at the latch input at a gate 91. Each latch 90 will remain false at these outputs A–H during a subsequent cycle of translation unless the subsequent output character requires a true signal. The complementary or opposite signal states of the output channels A–H are available at a set of output channels $\overline{A}$–$\overline{H}$.

The above description has concerned the translation of 12-bit Hollerith code into a more compact eight-bit code. Obviously output code characters of fewer channels or bits may be obtained by not threading a number of the cores 87 or by providing fewer output channels in the circuit. For an output code requiring more than eight bits, additional output channels may be provided by adding a number of transformer cores and associated latch circuitry.

It should be understood that, using a desired number of output bits, any desired output code character may be produced for a given input character with the basic circuit structure of this invention. The logic tree and gates need not be rewired. A proper wire is threaded through a combination of cores determined by the particular code representation of this desired output character. It should also be obvious that any nonstandardized Hollerith code character such as a punctuation character may be similarly translated into any desired output code character without requiring a change in the logic circuitry.

In addition to converting an input code into a code of fewer bits, the code translator as arranged for Hollerith code may be used, for instance, to expand 5-bit input code into 8-bit output code. Hollerith code allows, at most, five input channels to be true at once. That is, all of the field group channels 0, 11, and 12 may be true and, in the digit group, channel 8 may be true simultaneously with any one of the channels 2–7. It will be understood that all other possible signal level combinations of these five channels in addition to simultaneous true signals on all of them are permissible. By simply using only these five input channels and holding the remaining input signals false, the code translator of this invention may be used to expand five input bits into eight or less output bits.

The principles of the invention may be applied to the translation of other input codes of more or less than 12 bits. It should be understood from the foregoing description that a number of junctions corresponding to the number of legal or used input signal level combinations must be provided. Logic circuitry must also be provided which will select only the junctions corresponding to each input character. A conductor for each input character properly connecting these junctions must also be supplied.

Although a preferred embodiment of this invention is illustrated, it is understood that various modifications and rearrangements of components may be restored to without departing from the scope of the invention.

What is claimed is:

1. An electronic code converter for translating a set of input characters of a first code into a set of output characters of a second code, each of said input characters being represented by a plurality of input signals, said input signals being high or low level and being separated into first and second groups, various combinations of signal levels of said first group being defined as legal, a first group junction associated with each legal combination of signal levels of said first group, electrical current source means and electrical logic means, said logic means directing current from said current source means only to a selected first group junction associated with an input character to be translated, various combinations of signal levels of said second group being defined as legal, a second group junction associated with each legal combination of signal levels of said second group, a separate conductor connecting each first group junction with each second group junction, each conductor being associated with an input character, each of said output characters being represented by a plurality of output signals being high or low level, a core means for each output signal, each of said conductors being inductively linked with a predetermined combination of said core means, induction in a core means from current in a conductor producing an output signal of one level and the absence of induction in a core means producing an output signal of the opposite level, said logic means providing a current sink only at a selected second group junction associated with said input character to be translated thereby permitting the conductor associated with such character to carry current from said selected first group junction to said selected second group junction to produce an output signal level at each of said core means to represent an output character corresponding to said input character to be translated.

2. An electronic code converter for translating legal Hollerith code input characters into a set of output characters of a second code, each of said input characters being represented by a field group of signals and a digit group of signals, said signals each being high or low level, a junction of a first group associated with each legal combination of signal levels of said field group, and a junction of a second group associated with each legal combination of signal levels of said digit group, electrical current source means and electrical logic means, said logic means directing current from said current source means only to a selected junction of one of said groups associated with an input character to be translated and providing a current sink only at a selected junction of the other group associated with said input character to be translated, a separate conductor connecting each first group junction with each second group junction, each conductor being associated with a Hollerith character, each of said output characters being represented by a plurality of output signals being high or low level, a core means for each output signal, each of said conductors being inductively linked with a predetermined combination of said core means, induction in a core means from current in a conductor producing an output signal of one level and the absence of induction in a core means producing an output signal of the opposite level, the conductor associated with said input character to be translated carrying current between said selected junctions thereby producing an output character corresponding to said input character.

3. An electronic code converter as set forth in claim 2 wherein said logic means includes a logic tree which selects said junction of said first group.

4. An electronic code converter as set forth in claim 2 wherein said logic means includes a plurality of integrated circuit gates which select said junction of said second group.

5. An electronic code converter as set forth in claim 4 wherein means are provided to supply a strobe signal, and said selecting gates are controlled by said strobe signal.

6. An electronic code converter as set forth in claim 2 wherein each of said core means includes a transformer core, said conductors are selectively threaded through predetermined combinations of said transformer cores, each of said transformer cores having an associated secondary winding, current in a conductor passing through a transformer core inducing current in the associated secondary winding resulting in an output signal of one level, current in a conductor not passing through a transformer core not inducing current in its associated secondary winding and resulting in an output signal of the opposite level.

7. An electronic code converter as set forth in claim 6 wherein a latching circuit is provided for each core means, each latching circuit providing a high or low level output signal.

8. An electronic code converter as set forth in claim 7 wherein reset means are provided, said reset means driving the output of all of said latch circuits to a common signal level at the end of a cycle of character translation.

UNITED STATES PATENT OFFICE
CERTIFICATE OF CORRECTION

Patent No. 3,613,091 Dated October 12, 1971

Inventor(s) RALPH H. THOMAS and RONALD S. PERLOFF

It is certified that error appears in the above-identified patent and that said Letters Patent are hereby corrected as shown below:

Column 2, Lines 36 and 37, delete "Since any of the eight combinations of the digit group are legal."

Column 3, Line 75, insert -- of -- between "combination" and "signal".

Column 4, Line 37, delete "signal on the input channels 2 - 7 with a simultaneous true".

Column 4, Line 46, insert after "channels 2 - 7" and before "and channel 8":
-- and a simultaneous true signal on channel 8 is legal, the logic circuitry must check for such conditions and distinguish between a true signal on one of the channels 2 - 7 and simultaneous true signals on such a channel and channel 8.

-- The combination of simultaneous true signals on one of the channels 2 - 7 --.

Column 5, Line 42, insert -- signal -- between "legal" and "level".

Column 6, Line 32, change "shown" to -- shows --.

Column 8, Line 31, after "output" and before "character" insert -- signal level at each of said core means to represent an output --.

Signed and sealed this 11th day of April 1972.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334